United States Patent
Voss et al.

(12)

(10) Patent No.: US 6,359,316 B1
(45) Date of Patent: *Mar. 19, 2002

(54) METHOD AND APPARATUS TO PREVENT LATCH-UP IN CMOS DEVICES

(75) Inventors: Peter H. Voss, Watsonville; Andrew Walker; Jeff Watt, both of Mountain View; Ashish Pancholy, Milpitas; Cathal G. Phelan, Mountain View; Patrick Zicolello, Santa Clara; Christopher J. Petti, Menlo Park, all of CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/933,562

(22) Filed: Sep. 19, 1997

(51) Int. Cl.[7] ............... H01L 29/76; H01L 27/10; H01L 29/94; H01L 31/062

(52) U.S. Cl. .............. 257/369; 257/206; 257/372; 257/373

(58) Field of Search ............... 257/369, 372, 257/373, 206

(56) References Cited

U.S. PATENT DOCUMENTS

| 4,288,804 A | * | 9/1981 | Kikuchi et al. | ............ 257/373 |
| 4,651,190 A | * | 3/1987 | Suzuki et al. | ............ 257/206 |
| 4,937,645 A | * | 6/1990 | Ootsuka et al. | ............ 257/369 |

OTHER PUBLICATIONS

Webster's II New Riverside University Dictionary, 1984.*

* cited by examiner

Primary Examiner—Steven Loke
(74) Attorney, Agent, or Firm—Brinks Hofer Gilson & Lione

(57) ABSTRACT

A semiconductor (preferably a CMOS) device having one or more latch-up inhibitor diffusion regions. The latch-up inhibitor regions are adjacent to complementary P-channel and N-channel transistors, and typically function to inhibit or prevent latch-up, without increasing the die size of the device.

19 Claims, 3 Drawing Sheets

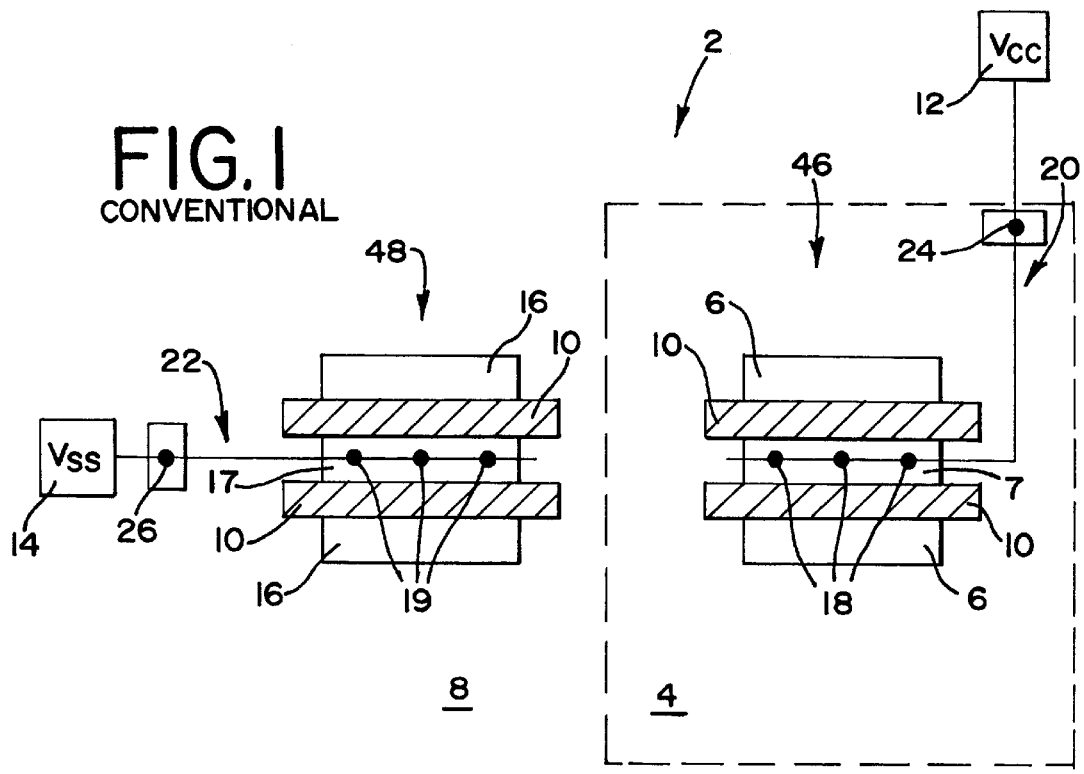
FIG.1
CONVENTIONAL
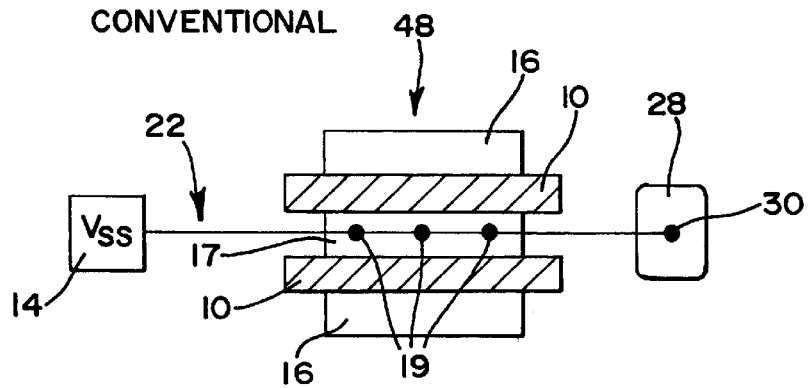
FIG.2
CONVENTIONAL

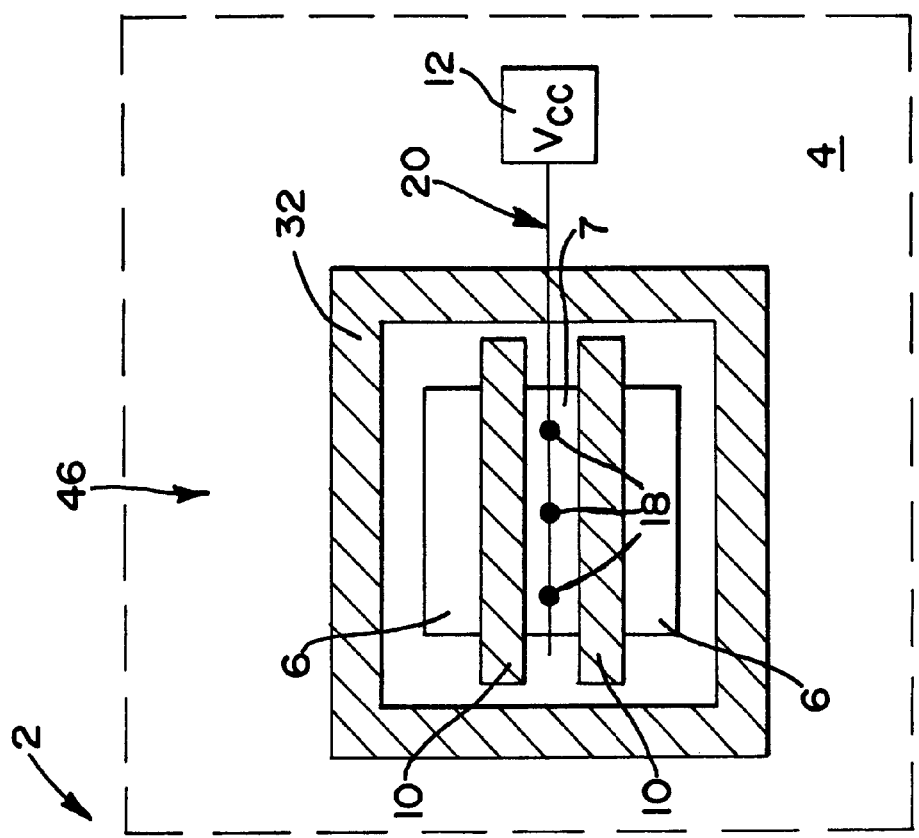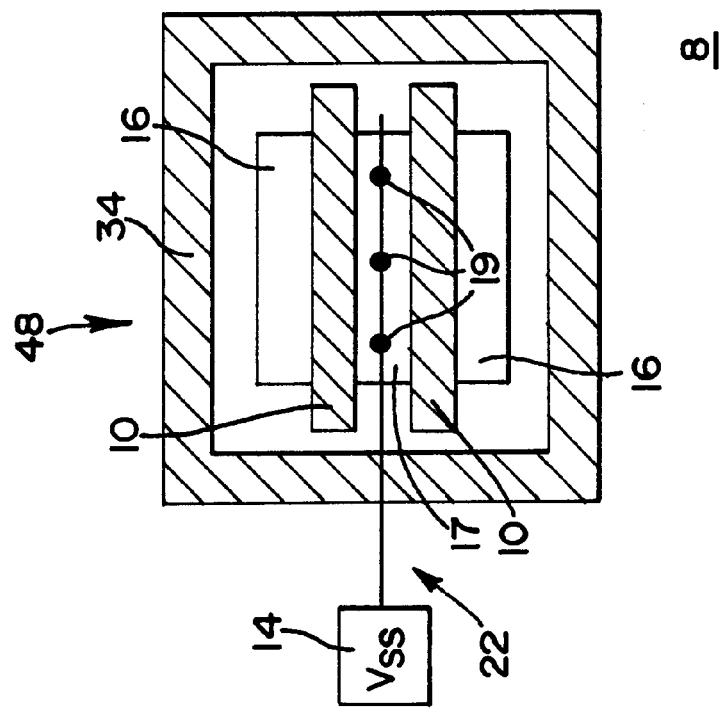
FIG. 3 CONVENTIONAL

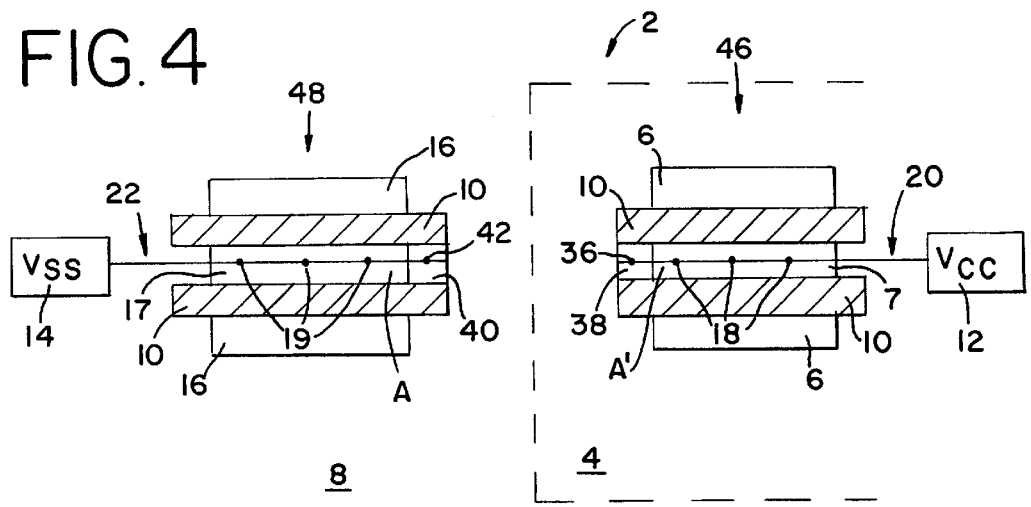
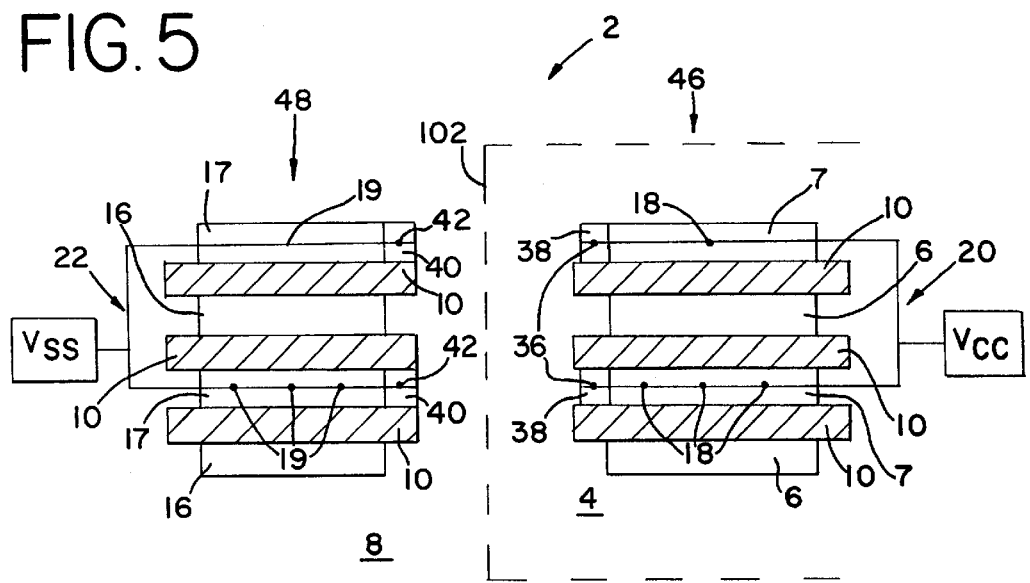
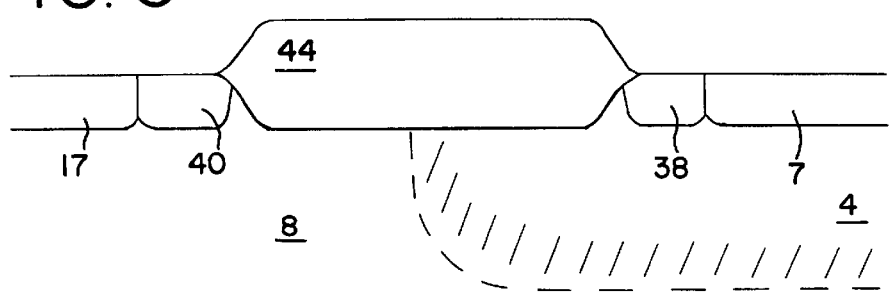

METHOD AND APPARATUS TO PREVENT LATCH-UP IN CMOS DEVICES

BACKGROUND OF THE INVENTION

1. Field of the Invention

The invention relates to a CMOS device, methods of making and using these devices, and method of preventing latch-up.

2. Discussion of the Art

CMOS devices have a variety of advantages, such as improved switching speed and power dissipation. However, these devices can suffer from latch-up.

Latch-up is a well understood and documented phenomenon which results from parasitic bipolar transistors present in the CMOS device. When a CMOS device experiences latch-up, there is a large self-sustaining current flow between power supply terminals which can lead to destruction of the device, and can only be stopped by disconnecting the power supply. Latch-up is a local phenomenon, and methods for preventing latch-up typically adjust the location or architecture of the CMOS device. CMOS devices, the latch-up phenomenon, as well as a variety of methods for preventing latch-up, are described in U.S. Pat. Nos. 4,647,956; 4,660,067; 5,055,903; 5,159,204; 5,379,147; and 5,406,513; as well as in *Device Electronics for Integrated Circuits*, $2^{nd}$ Edition, Richard S. Muller and Theodore I. Kamins, pp. 454–467 (John Wiley & Sons, 1986).

FIG. 1 illustrates a CMOS device 2 including elements to prevent latch-up. The substrate 8 is a P-type substrate. A set of P-channel transistors 46 are in an N-well 4 while a set of N-channel transistors 48 are in the P-type substrate 8. The set of P-channel transistors 46 have P+ diffusion regions 6 and 7 which may act as sources and drains. Similarly, the set of N-channel transistors 48 have N+ diffusion regions 16 and 17 which may act as sources or drains. Both sets of P-channels transistors 46 and N-channel transistors 48 have gates 10. As illustrated, there are a plurality of contacts 18 and 19 which electrically connect a P+ diffusion region 7 or N+ diffusion region 17 to either Vcc 12 or Vss 14, respectively, via buses 20 or 22, respectively. In order to inhibit latch-up, additional contacts 24 and/or 26 are placed on the periphery of the device, and are electrically connected to Vcc 12 or Vss 14, via buses 20 or 22, respectively. The primary differences between diffusion regions 7 and 17 include (a) the bus electrically coupled to 7 and 17 and (b) the dopant conductivity type (P vs. N).

FIG. 2 illustrates another way of preventing latch-up. Only a set of N-channel transistors 48 of the CMOS device 2 are shown in this figure. Similarly to FIG. 1, the set of N-channel transistors 48 include N+ diffusion regions 16 and 17 and gates 10. Also present are contacts 19 which electrically connect N+ diffusion region 17 to Vss 14 via bus 22. In order to prevent latch-up in this device, a "tap" P+ diffusion 28 is electrically connected to Vss 14 via contact 30 and bus 22.

FIG. 3 illustrates yet another way of preventing latch-up. Similarly to FIG. 1, CMOS device 2 has a set of P-channel transistors 46 and a set of N-channel transistors 48. The set of N-channel transistors include N+ diffusion regions 16 and 17, gates 10, and contacts 19 electrically connecting diffusion region 17 to Vss 14 via bus 22. The set of P-channel transistors 46 include P+ diffusion regions 6 and 7, gates 10, and contacts 18 electrically connecting diffusion region 7 to Vcc 12 via bus 20, all located within N-well 4. To prevent latch-up, the P-channel transistors are surrounded by guard ring 32 which functions to collect the excess majority carriers in the N-well, and thereby isolate the circuit element from excess carriers which may exist outside the guard ring. The guard ring is a "tap" N+ diffusion. Similarly, the N-channel transistors are surrounded by guard ring 34 composed of a "tap" P+ diffusion.

A major disadvantage of the above-described methods for preventing latch-up is that they all require a significant increase in the die size of the CMOS device. Accordingly, there is a great need for a way to prevent latch-up which does not increase the size of the CMOS device.

SUMMARY OF THE INVENTION

An object of the present invention is to provide a CMOS device with resistance to latch-up, but which does not have an enlarged die size.

Another object of the invention is to provide a CMOS device having a high ratio of latch-up voltage to power supply voltage.

Another object of the invention is to provide a method of making such CMOS devices.

Another object of the invention is to provide methods for using such CMOS devices.

Another object of the invention is to provide a method of inhibiting latch-up without increasing die size.

These objects are made possible by a semiconductor device, comprising (i) a set of at least one P-channel transistors, (ii) a set of at least one N-channel transistors, (iii) a latch-up inhibitor P+ tap region, and (iv) a latch-up inhibitor N+ tap region, wherein the sets of P-channel and N-channel transistors are complementary.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 illustrates a prior approach to preventing latch-up.

FIG. 2 illustrates a second prior approach to preventing latch-up.

FIG. 3 illustrates a third prior approach to preventing latch-up using guard rings.

FIG. 4 illustrates an embodiment of the present invention.

FIG. 5 illustrates another embodiment of the present invention.

FIG. 6 illustrates a cross section from points A to A' in FIG. 4.

DETAILED DESCRIPTION OF THE INVENTION

An embodiment of the present invention is illustrated in FIG. 4. Similar to FIG. 1, this device includes a set of P-channel transistors 46 and a set of N-channel transistors 48, including P+ diffusion regions 6 and 7 and N+ diffusion regions 16 and 17, respectively, as well as gates 10. A source/drain terminal of one or more P-channel transistors 46 may be connected to Vcc 12 via plugs or contacts 18 and/or bus 20. Similarly, a source/drain terminal of one or more N-channel transistors 48 may be connected to Vss 14 via plugs or contacts 19 and bus 22. In order to prevent or inhibit latch-up, P-channel transistors 46 and N-channel transistors 48 have therein one or more latch-up inhibitor N+ implant (tap) regions 38 and latch-up inhibitor P+ implant (tap) regions 40, respectively. In this application, a "tap" region refers to a region separately implanted with one or more dopants of the same conductivity type (e.g., P or N) as the surrounding well or substrate. On the other hand, a "diffusion" region refers to a region implanted with one or more dopants of a conductivity type different from the surrounding well or substrate.

The N-channel latch-up inhibitor may comprise a P+ tap region, and a plug or contact 42 that electrically connects it to Vss 14 via bus 22. Likewise, the P-channel latch-up inhibitor may comprise a N+ tap region, and a plug or contact 36 electrically connected to Vcc 12 via bus 20. In general, a P+ doping level is greater than the P doping level; likewise, the N+ doping level is greater than the N doping level. Preferably, the doping levels satisfy $10^{13}$ $cm^{-3} \leq N \leq 10^{19}$ $cm^{-3}$, $10^{13}$ $cm^{-3} \leq P \leq 10^{19}$ $cm^{-3}$, $10^{15}$ $cm^{-3} \leq N+ \leq 10^{21}$ $cm^{-3}$, $10^{15}$ $cm^{-3} \leq P+ \leq 10^{21}$ $cm^{-3}$, more preferably, $10^{15}$ $cm^{-3} \leq N \leq 10^{18}$ $cm^{-3}$; $10^{15} \leq P \leq 10^{18}$ $cm^{-3}$; $10^{19}$ $cm^{-3} \leq N+ \leq 10^{21}$ $cm^{-3}$; $10^{11}$ $cm^{-3} \leq P+ \leq 10^{21}$ $cm^{-3}$. These latch-up inhibitor regions inhibit or prevent latch-up in the inventive devices particularly when coupled to a voltage/power bus.

The latch-up inhibitor (tap) regions of the present invention may be located between the complementary transistors of the CMOS device preferably closer to the (substantially vertical) N-well/P-substrate junction between the CMOS transistors than to any other N-well/P-substrate junction between other CMOS transistors. In this application, a "P-N junction" refers to the interface between either (a) a well (or a diffusion region) and a substrate of opposite conductivity types, or (b) two wells of opposite conductivity types, as opposed to a well and a diffusion region therein. Since the gates of the transistors often extend towards each other beyond the diffusion regions (sources and drains), the latch-up inhibitor regions may also be placed adjacent to a diffusion region, without completely extending beyond the gate. The latch-up inhibitor regions are also placed adjacent to a gate of the same transistors. In the context of the present invention, "adjacent" means that at least a portion of the latch-up inhibitor region is closer to at least a portion (e.g. the nearest portion) of the nearest (adjacent) reference structure (e.g., a gate, P-N interface/junction, well, etc.), than to any portion of any other reference structures. For example, the distance between the closest edge of the latch-up inhibitor region to the closest edge of the closest diffusion region is at most 0.65 um, more preferably at most 0.5 $\mu$m, even more preferably at most 0.35 $\mu$m or at most 0.25 $\mu$m, most preferably at most 0.18 $\mu$m (including 0 to 0.18 $\mu$m). In this fashion, the latch-up inhibitor region may be added to a CMOS device without increasing the die size of the device.

Furthermore, the process of making the CMOS device involves the same number of masks and implants as conventional CMOS processes that do not form taps, i.e., an N+ tap region may be implanted at the same time as an N+ diffusion region, a P+ tap region may be implanted at the same time as a P+ diffusion region.

Furthermore, the latch-up inhibitor region may be placed adjacent to a diffusion region which has a power supply bus, so that the bus may be extended past the transistor source/drain region by only a small amount to electrically connect the latch-up inhibitor region with the appropriate power supply (Vss or Vcc). The CMOS devices of the present invention may be made using SAC (self-aligned contact) technology, for example, using the processes described in U.S. Pat. Nos. 4,711,701; 5,385,634; 5,258,096; and 5,166,771, the relevant portions of which are incorporated herein by reference.

Thus, the present invention further concerns a process for making a latch-up inhibition or prevention structure, comprising the steps of:

(a) implanting a first amount of a first dopant of a first conductivity type and a second amount of a second dopant of said first conductivity type into regions of a semiconductor substrate corresponding to (i) a first latch-up inhibitor and (ii) a first diffusion region, respectively, said first amount is same as or different from said second amount, said first dopant is the same as or different from said second dopant, said first latch-up inhibitor region being adjacent to a second diffusion region;

(b) implanting a third amount of a third dopant of a second conductivity type and a fourth amount of a fourth dopant of said second conductivity type into regions of the semiconductor substrate corresponding to (i) a second latch-up inhibitor region and (ii) an second diffusion region, respectively, said third amount is same as or different from said fourth amount, said third dopant is the same as or different from said fourth dopant, said second latch-up inhibitor region being adjacent said first diffusion region;

(c) depositing an electrically conductive material onto at least one (preferably at least 2) of said latch-up inhibitor regions to form the latch-up inhibition or prevention structure.

The diffusion regions are sources and/or drains of CMOS transistors. The latch-up inhibitor regions are closer to a P-N junction between the CMOS transistors having these diffusion regions than to any other P-N junctions between other CMOS transistors.

In a preferred embodiment, the semiconductor further comprises a field oxide layer overlying the substrate. In this case, the field oxide typically overlies the P-N junction, but not the tap regions. The method may also further comprise removing conductive material from some or all regions (but at least leaving plugs, contacts or interconnects to the latch-up inhibitor regions) of the semiconductor substrate.

Contacts, vias, plugs or other electrical connections (hereinafter "contacts") may be formed between the bus(ses) and an underlying electrical structure (e.g., a transistor gate, source or drain; a local interconnect between transistor structures; a bitline, wordline or other "metallization" structure; a doped substrate well; etc.) at the same time as and/or using the same process steps used to form the electrically conductive material of the latch-up inhibition or prevention structure, in accordance with processes known in the art. Adjacent electrically conductive structures or levels may be separated by dielectric materials, as is known in the art. Such dielectric materials may be formed by processes known in the art.

A cross-section between points A and A' in FIG. 4 is illustrated in FIG. 6. The layers above the field oxide and diffusion regions, have been omitted for clarity. Shown in FIG. 6 is P-type substrate 8 and N-well 4. The N+ diffusion region 17 with a power supply bus is adjacent to the latch-up inhibitor region (P+ diffusion) 40 both in P-type substrate 8. Likewise, P+ diffusion region 7 with power supply bus is adjacent to the latch-up inhibitor region (N+ diffusion) 38, both of which are in N-well 4. Between the two latch-up inhibitor regions is field oxide 44. A straight line may be drawn which passes through the N well 17, latch-up inhibitor region 40, field oxide 44, latch-up inhibitor region 38 and P well 7.

FIG. 5 illustrates a CMOS device with a set of P-channel transistors 46 having a total of three gates, and the complementary set of N-channel transistors 48 also having a total of three gates. Here, the set of P-channel transistors 46 have two P+ diffusion regions 7 having a bus 20, and the set of N-channel transistors 48 also have two N+ diffusion regions 17 having a bus 22. Two latch-up inhibitor regions 38 (N+ diffusion) are adjacent to diffusion regions 7, and two latch-up inhibitor regions 40 (P+ diffusion) are adjacent to diffusion regions 17. Other parts illustrated are the same as similarly numbered parts in FIG. 4. Alternatively, a third latch-up inhibitor region in the well may be adjacent to the third gate and the third diffusion region with the same conductivity type as the well, and a fourth latch-up inhibitor region in the substrate or a fourth well may be adjacent to the fourth gate and the second diffusion region, having the same conductivity type as the substrate or second well.

CMOS devices may comprise a P-type substrate and an N-well, or a N-type substrate and a P-well. Also possible is a dual well device. The present invention is applicable to CMOS, BiCMOS, and possibly even NMOS or PMOS, any of which may include core circuits any circuits. A preferred use is in CMOS memory circuits and/or in logic circuits. The devices of the invention may be in the memory cells or peripheral circuits of a memory chip, such as an SRAM or DRAM, or both memory cells and peripheral circuits. Preferably, however, the present latch-up inhibitor structures are located in transistor wells in the periphery of the memory circuit (as opposed to within the memory array itself).

The traditional methods or steps previously used to form CMOS devices can be used in the present invention. This may simply involve the modification of existing steps. The contacts to these regions can be formed simultaneously with the contacts to the N+ diffusion regions and P+ diffusion regions (sources and drains) of the P-channel and N-channel transistors, respectively. Furthermore, the bus which connects the taps of the P-chaimel transistors or N-channel transistors to Vcc or Vss, respectively may be extended in length by a small distance (relative to an identical structure without the latch-up inhibitor) to connect the latch-up inhibitor regions with either Vcc or Vss. Alternatively, electrical connections to Vss or Vcc can be provided by a local interconnect layer to accommodate the small size of the tap. As illustrated, the latch-up inhibitor regions are provided at an N+ diffusion or P+ diffusion (source or drain) having a power supply bus, however, the latch-up inhibitors may be present at every structure, resulting in 2, 3, or more latch-up inhibitor regions for each set of transistors, to provide increased protection against latch-up.

The device of the present invention may be made by implanting a dopant into a substrate, which may itself be doped, to form one or more wells (which may independently be an N-well, P-well, N$^+$well, P$^+$well, N$^{++}$well, P$^{++}$well, N$^-$well, or P$^-$well, but if the substrate is doped with one of N-dopants and P-dopants, the well is doped with the other, where P$^{++}$refers to a higher level of doping than P$^+$[likewise for N$^+$and N$^{++}$] and P$^-$refers to a lower level of doping than P [likewise for N$^-$and N]). Two complementary diffusion regions (one in the substrate, the other in the well) may form one or more source and/or drain of the CMOS transistors. Some regions may be formed before and some regions after formation of the gates. Contacts, vias, dielectric layers and busses may be formed as discussed elsewhere in this application. However, the present latch-up inhibitor region is preferably formed adjacent to a gate strip (e.g., gate 10 in FIG. 5) by SAC technology and/or processing (i.e., after formation of the gate layer).

The present invention may provide unexpected improvements in latch-up inhibition and/or prevention, and/or area savings, regardless of the number of gates and/or latch-up inhibitor regions (per well), the orientation of the gate strips and/or the location of the latch-up inhibitor region(s) with respect to the well/substrate interface (e.g., see P/N junction 102 in FIG. 5), etc. In FIG. 5, gate strips 10 are shown as being substantially perpendicular to the well interface 102. However, other orientations (e.g., substantially parallel, substantially at an angle of from 5 to 85 degrees, or a combination thereof) may be acceptable, as may be combinations thereof with other CMOS transistors having gates substantially perpendicular orientation to the P/N junction. The location of the latch-up inhibitor region is also preferably in a substrate, a CMOS N-well, and/or a CMOS P-well.

The present latch-up inhibitor is also preferably configured to provide the lowest-resistance pathway for charge flow to and/or from a power bus (e.g., Vcc, Vss). However, the flow of electricity between a power bus and an external (i.e. off-chip) power supply may be controlled by one or more gating devices (e.g., a diode or stack thereof; a silicon controlled rectifier (SCR) circuit; a transistor or other switching device controlled directly or indirectly by a reference signal [e.g., Vcc, an input signal from an input pad an/or pin; etc.]), as is known in the art.

A set of transistors may have only a single transistor containing a source, a drain and a gate, or a set of transistors may have more than one transistor, such as 2 to 100 transistors or 3 to 50 transistors. The transistors may be separate, each having its own separate source, drain and gate, or groups of transistors may share sources, drains and/or gates. Also, as illustrated in the figures, the source of one transistor may serve as the drain of another.

The processing steps for making the CMOS devices of the present invention are conventional, and well known to those of ordinary skill in the art. They are also described in *Encyclopedia of Chemical Technology*, Kirk-Othmer, Volume 14, pp. 677–709 (1995), and *Semiconductor Device Fundamentals*, Robert F. Pierret, Addison-Wesley, 1996. Conventional chemical-mechanical polishing is described in U.S. Pat. Nos. 4,789,648, 4,954,142 and 5,262,354.

The substrate may typically be a semiconductor material conventionally known by those of ordinary skill in the art. Examples include silicon, gallium arsenide, germanium, gallium nitride, aluminum phosphide, diamond and alloys such as $Si_{1-x}Ge_x$ and $Al_xGa_{1-x}As$, where $0 \leq x \leq 1$. Many others are known, such as those listed in *Semiconductor Device Fundamentals*, on page 4, Table 1.1 (Robert F. Pierret, Addison-Wesley, 1996). Furthermore, the substrate often may have a top layer of an oxide, such as silicon oxide, which can act to protect the substrate, and/or as the gate oxide of a transistor. Usually, the source and drain regions of the transistor are formed in the substrate.

The gate and gate layer are typically made from highly doped polysilicon. The resistivity of silicon can be controlled over a wide range by varying the concentration of impurities such as phosphorous, boron and/or arsenic, as described in *Microchip Fabrication*, Peter Van Zant, pp. 21–42 (McGraw-Hill, 1990). One of ordinary skill in the art is familiar with the amounts and identities of dopants used to provide the polysilicon of the gate with its desired properties and function(s). Other conductors conventionally known to those of ordinary skill in the art, which have a resistivity on the same order as that of the highly doped polysilicon, can also be used for the gate or gate layer. Examples include $WSi_x$, Al, W, Ti, Zr, Mo, and alloys thereof (e.g. TiW alloy, or a silicide such as $CoSi_x$, $HfSi_x$, $MoS_x$, $NiSi_x$, $Pd_2Si$, PtSi, $TaSi_x$, $TiSi_2$, WSi, $ZrSi_x$ and $CrSi_2$). A P-type or N-type substrate has a level of doping compatible with the N-channel or P-channel transistors formed in these substrates, while an N-well or P-well is doped to compensate the substrate and to provide the appropriate characteristics for the transistors formed in the well. P+ and N+ refers to a level of doping higher than that of an N-well or P-well, as may be appropriate for a source, drain or ohmic contact region. A conductivity type refers to a semiconductor material doped with p-type or n-type dopants, as is well known in the art. Furthermore, the more dopant of a particular type, the greater the conductivity (or the lower the resistivity) of the doped region.

A metal layer or bus typically contains Al or an aluminum alloy, but virtually any metallic electrical conductor (e.g., copper, alloys of copper and aluminum, etc.) can be used. A metallic conductor typically has a resistivity of $10^{-2}$ ohm-cm or less. The metal layer or bus may further comprise wetting, protective, adhesive and/or barrier layers (e.g., titanium, tungsten, and alloys thereof) between it and adjacent materials and/or layers. Likewise, any good electrical conductor, such as tungsten, aluminum, copper, or an alloy thereof, may be suitable for contacts.

The doping of the semiconductor substrate to form P+ diffusion and N+ diffusion regions (source and drain) may be conducted by methods known to those of ordinary skill in the art, using materials known to those of ordinary skill in the art for their known purposes. For example, N-type and P-type doping of a semiconductor substrate (which may be light or heavy) may accomplished by conventional methods known to those of ordinary skill in the art. Dopant species such as arsenic, phosphorus, and boron may be added by well known techniques such as ion implantation and (optionally) diffusion. Implantation may be followed by annealing and/or "drive-in" steps to deliver the dopant in a desired fashion. Such annealing and drive-in steps may be conducted by conventional methods known to those of ordinary skill in the art. The locations of the source and drain regions may be self-aligned with the gate material.

The present transistor may also be equipped with contacts (e.g. electrical contacts or taps) to the source, drain and gate material on other parts of the device, or to other devices, which may be formed by conventional methods known to those of ordinary skill in the art. Examples of suitable contact materials include metals such as aluminum, titanium, zirconium, chromium, molybdenum, tungsten or alloys thereof (e.g., TiW). When the contact is aluminum, alloying of the aluminum with silicon may be conducted to reduce dissolution of source and drain silicon into the aluminum.

The present invention provides a dramatic improvement in the resistance of devices to latch-up. Two tests exist for measuring the susceptibility of a device to latch-up: a static test and a dynamic test. The dynamic test, the only test used here to measure latch-up resistance and latch-up ratios, increases the power supply voltage applied to the device with the device at operating speed and high temperature (e.g. 70–125° C.) until latch-up occurs. In the past, otherwise identical devices that typically fail a standard latch-up test at 5/2 volts without the inventive latch-up inhibitor structures now withstand at least 10 volts in the same test as a result of having the inventive latch-up structures on power/ground busses serving peripheral wells. The improvement can also be measured as the latch-up ratio, the ratio of the voltage at which latch-up occurs, to the normal voltage at which the device operates (typically 3.3 or 2.5 volts), under a conventional dynamic latch-up test. Preferably, the latch-up ratio is at least 1.2:1. Further examples of suitable latch-up ratios include at least 1.5:1, at least 3:1, at least 5:1, and at least 10:1. Furthermore, other latch-up preventative measures, such as guard rings (FIG. 3), extensions of a source or drain with a tap (FIG. 2), or taps not located between gate strips (FIG. 1), are not necessary, but may be employed for other reasons (e.g., ESD or further latch-up inhibition/prevention).

Obviously, numerous modifications and variations of the present invention are possible in light of the above teachings. It is therefore to be understood that within the scope of the appended claims, the invention may be practiced otherwise than as specifically described herein.

All citations in this application are hereby incorporated by reference.

What is claimed as new and is desired to be secured by letters patent of the united states is:

1. In a CMOS device having complementary sets of P-channel and N-channel transistors, first transistors each comprising a first gate and an N-type diffusion region, and second transistors each comprising a second gate and a P-type diffusion region, the improvement being a first latch-up inhibitor P+ tap region adjacent to said first gate and in direct contact with said N-type diffusion region, and a second latch-up inhibitor N+ tap region adjacent said second gate and said P-type diffusion region, wherein there is no source or drain region intervening between said first latch-up inhibitor P+ tap region and said first gate, along the shortest path between said first latch-up inhibitor P+ tap region and said first gate, and there is no source or drain region intervening between said second latch-up inhibitor N+ tap region and said second gate, along the shortest path between said second latch-up inhibitor N+ tap region and said second gate.

2. The CMOS device of claim 1, wherein said device has a latch-up ratio of at least 1.5:1.

3. A semiconductor device, comprising:
(i) a substrate having a first conductivity type;
(ii) a first well having a second conductivity type;
(iii) a first transistor in said first well, said first transistor comprising a first diffusion region and a first gate, said first diffusion region having said first conductivity type;
(iv) a second transistor in said substrate or a second well, said second transistor comprising a second diffusion region and a second gate, said second well having said first conductivity type, said second diffusion region having said second conductivity type;
(v) a first latch-up inhibitor region in said first well, adjacent to said first gate and in direct contact with said first diffusion region, having said second conductivity type;
(vi) a second latch-up inhibitor region in said substrate or said second well, adjacent to said second gate and said second diffusion region, having said first conductivity type;
wherein said first latch-up inhibitor region has a higher conductivity than said first well,
said second latch-up inhibitor region has a higher conductivity than said substrate or said second well,
each of said latch-up inhibitor regions is closer to a P-N junction between said transistors than to any other P-N junctions between other transistors,
there is no source or drain region intervening between said first latch-up inhibitor region and said first gate, along the shortest path between said first latch-up inhibitor region and said first gate, and
there is no source or drain region intervening between said second latch-up inhibitor region and said second gate, along the shortest path between said second latch-up inhibitor region and said second gate.

4. The semiconductor device of claim 1, comprising:

(vii) a third transistor, comprising a third diffusion region and a third gate, in said first well; and (viii) a fourth transistor, comprising a fourth diffusion region and a fourth gate in said substrate or said second well.

5. The semiconductor device of claim 4, further comprising (xi) a third latch-up inhibitor region in said first well, adjacent to said third gate and said third diffusion region, having said second conductivity type;

(xii) a fourth latch-up inhibitor region in said substrate or said second well, adjacent to said fourth gate and said fourth diffusion region, having said first conductivity type.

6. The semiconductor device of claim 1, further comprising:

(ix) a first contact electrically connecting said first latch-up inhibitor region to a first power bus, and (x) a second contact electrically connecting said second latch-up inhibitor region to a second power bus.

7. A CMOS integrated circuit, comprising:

(a) one or more core circuits, and (b) one or more peripheral circuits comprising the semiconductor device of claim 6.

8. The semiconductor device of claim 1, wherein said device has a latch-up ratio of at least 1.2:1.

9. The semiconductor device of claim 1, wherein said device has a latch-up ratio of at least 3: 1.

10. An integrated circuit comprising the semiconductor device of claim 9.

11. The semiconductor device of claim 1, wherein the distance between the closest edge of at least one of said first and second latch-up inhibitors to the closest edge of the source closest to at least one of said first and second latch-up inhibitors, is at most 0.65 $\mu$m.

12. The semiconductor device of claim 11, wherein said distance is at most 0.35 $\mu$m.

13. A process for making the device of claim 1, comprising:

forming diffusion regions having said first conductivity type and diffusion regions having said second conductivity type, in a substrate, wherein at least one of said diffusion regions having said second conductivity type is said first latch-up inhibitor region, and at least one of said diffusion regions having said first conductivity type is said second latch-up inhibitor region.

14. The process of claim 13, wherein said forming diffusion regions comprises:

(a) patterning regions of a mask overlying a semiconductor substrate corresponding to regions having said first conductivity type;

(b) implanting a first dopant into exposed regions of said semiconductor substrate to form said regions having said first conductivity type;

(c) patterning regions of a mask overlying a semiconductor substrate corresponding to regions having said second conductivity type;

(d) implanting a second dopant into exposed regions of said semiconductor substrate to form said regions having said second conductivity type.

15. The process of claim 14, further comprising:

(e) depositing an electrically conductive material onto at least one exposed region corresponding to at least one of said latch-up inhibitor regions.

16. The method of claim 15, further comprising, after the deposition of step (e), (f) removing conductive material from some or all regions other than said at least one of said latch-up inhibitor regions.

17. An integrated circuit comprising the semiconductor device of claim 1.

18. An integrated circuit comprising the semiconductor device of claim 17, wherein said device comprises one or more array circuits and at least one peripheral circuit, and said at least one peripheral circuit comprises said semiconductor device.

19. An integrated circuit comprising the semiconductor device of claim 18, wherein at least one of said array circuits is a memory array circuit.

* * * * *